United States Patent [19]

Viehmann

[11] 4,262,206

[45] Apr. 14, 1981

[54] FLUORESCENT RADIATION CONVERTER

[75] Inventor: Walter Viehmann, Rockville, Md.

[73] Assignee: The United States of America as represented by the Administrator of the National Aeronautics and Space Administration, Washington, D.C.

[21] Appl. No.: 111,439

[22] Filed: Jan. 11, 1980

[51] Int. Cl.³ .............................................. G01J 1/58
[52] U.S. Cl. .................................... 250/483; 250/368
[58] Field of Search ................. 250/483, 368; 136/427

[56] References Cited

U.S. PATENT DOCUMENTS

| 4,146,790 | 3/1979 | Goetzberger et al. | 250/368 |
| 4,173,495 | 11/1979 | Rapp et al. | 136/427 |

Primary Examiner—Harold A. Dixon
Attorney, Agent, or Firm—Robert D. Marchant; John R. Manning; John O. Tresansky

[57] ABSTRACT

A fluorescent radiation converter (10) having a substantially undoped optically transparent substrate (12) and a waveshifter coating (14) deposited on at least one portion of substrate (12) for absorption of radiation (16) and conversion thereof to fluorescent radiation (18). Coating (14) is formed of substantially 1000 g/liter of a solvent, 70 to 200 g/liter of an organic polymer, and 0.2 to 25 g/liter of at least one organic fluorescent dye. The incoming incident radiation (16) impinges on coating (14) and enters therein. Radiation (16) is absorbed by the fluorescent dye and is re-emitted as a longer wavelength radiation (18). Radiation (18) is trapped within substrate (12) and is totally internally reflected by boundary surfaces (22) and (24) towards ends (20). Emitted radiation (18) leaves ends (20) to be detected.

17 Claims, 6 Drawing Figures

FIG. 2B.
FIG. 2C.
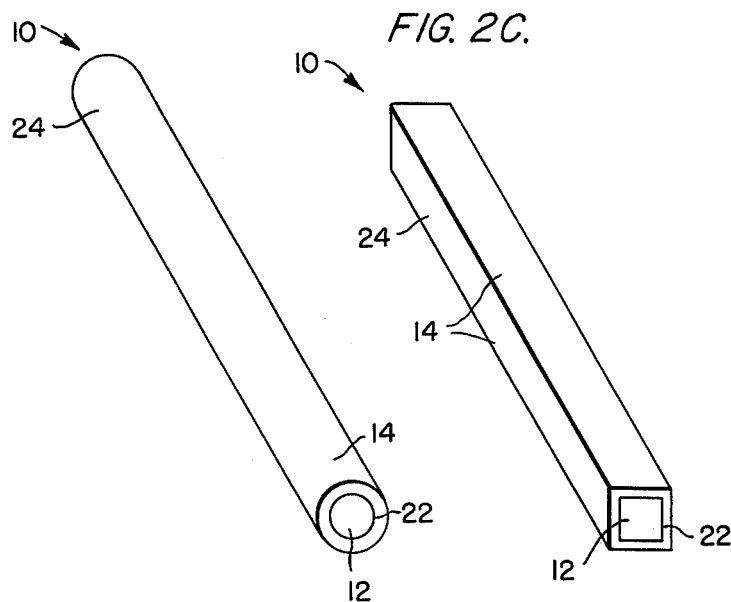
FIG. 4.
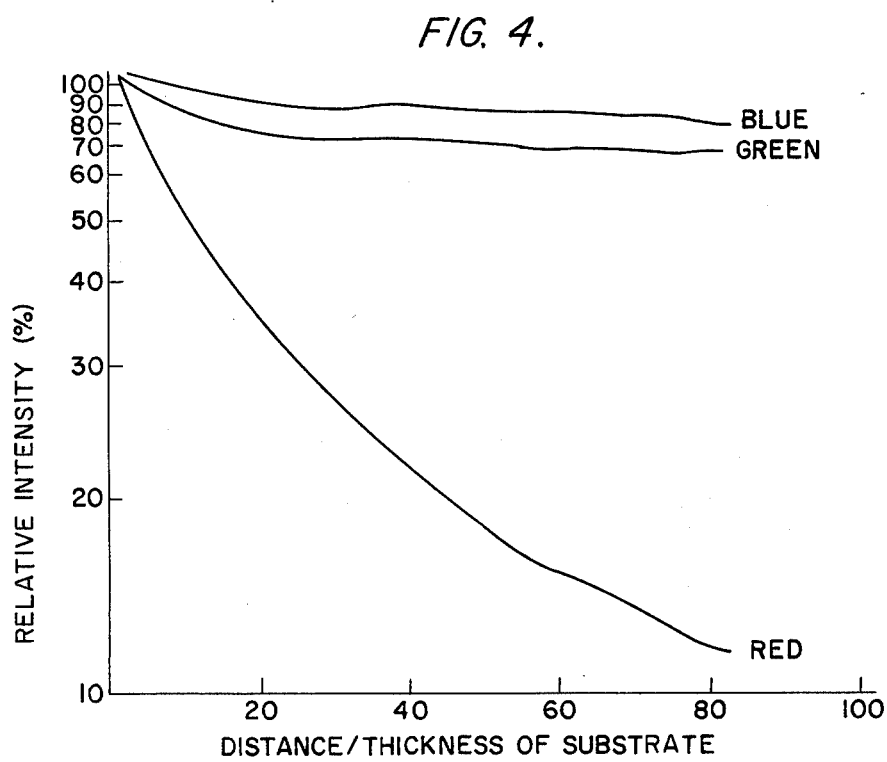

FLUORESCENT RADIATION CONVERTER

ORIGIN OF THE INVENTION

The invention described herein was made by an employee of the United States Government and may be manufactured and used by or for the Government for governmental purposes without the payment of any royalties thereon or therefor.

DESCRIPTION

1. Technical Field

The invention relates generally to radiation converters and more particularly to fluorescent radiation converters.

In many industrial and scientific endeavors it is desirable to convert incoming radiation to a longer wavelength for detection. One area where such conversion is desirable to where the incoming radiation is to be amplified prior to detection. The incoming radiation is collected by a relatively large surface area and the converted longer wavelength radiation is trapped and emitted through a relatively small surface area so that the intensity at the small surface is many times greater than the intensity of the incoming radiation. Such techniques are extremely useful in such industrial areas as liquid crystal displays where greater light concentration is needed to visibly display the readout. Another area of use is in scintillation counters where low level radiation is to be detected. Still another area of use is in the conversion of solar energy such as photovoltaic conversion techniques. In all these areas, it is customary to convert the incoming radiation to fluorescent radiation having a longer wavelength than the incident radiation.

2. Background Art

In all radiation converters the basic conversion technique is substantially the same. A flat plate of transparent material is doped throughout with a substance which will absorb the incoming radiation and emit radiation at a longer wavelength. Fluorescent dyes dissolved within the transparent plate at the time of manufacture produces proper conversion. When the incident radiation contacts the surface of the flat plate, the radiation enters the plate and is absorbed by the fluorescent dye and is converted to fluorescent radiation at a longer wavelength. Ideally, the fluorescent radiation is internally reflected between the two boundary layers of the flat plate until the fluorescent radiation reaches an edge of the flat plate where it exits to an appropriate detector. This technique is extremely attractive for low light scintillation, liquid crystal display, and solar energy conversion because the diffuse, low intense, nondirectional light can be collected over large areas and then shifted to a wavelength range matched to an appropriate detector and emitted over a small area. Thus, a higher radiance of useful radiation can be achieved relative to that of the incident radiation.

Such fluorescent radiation converters have some distinct disadvantages. One disadvantage is that the fluoescent dye must be dissolved entirely within the substrate. Thus, the material chosen for the substrate must be one in which the particular fluorescent dye to be used will readily dissolve. This will limit the type of substrate chosen and in many instances the substance material will not have the good optical quality that is necessary for the desired use of the fluorescent radiation converter.

Another disadvantage is that not all the incident radiation on the collector will enter the collector and be totally absorbed by the fluorescent converting material which is desirable. The amount of absorption is in direct proportion to the amount of fluorescent material with which the collector plate is doped. Thus, the more fluorescent material within the collector the greater will be the absorption of incident radiation. It is a characteristic of fluorescent material to reabsorb the emitted fluorescent radiation. Thus, the attenuation length of the fluorescent radiation traveling transversely through the collector is extremely short, such as on the order of a few centimeters. This short travel length is entirely unsatisfactory for many applications where large surface areas are needed to collect the incident radiation and the emitted fluorescent radiation must travel large distances to the edge of the collector. To counteract the reabsorption of the fluorescent material, the prior art technique is to decrease the fluorescent material concentration in the collector; however, the amount of incident radiation absorbed also decreases proportionally, and the conversion to the longer wavelength light decreases more than proportionally which lowers the conversion efficiency, which is undesirable.

Another disadvantage with the prior art devices is that as the converted longer wavelength radiation is totally internally reflected it will be scattered by imperfections within the collector and by surface imperfections. These imperfections cause the fluorescent radiation to scatter in all directions throughout the collector causing additional losses and escape of the fluorescent radiation through the boundary layers of the collector. Thus, a large portion of the fluorescent radiation will not be totally internally reflected which decreases the attenuation length within the collector and decreases the intensity of the fluorescent radiation at the edge of the collector. Because the substrate material in the prior art radiation converters are limited to material in which the fluorescent dyes are soluble, many of these substrate materials inherently contain the imperfections that cause scattering.

Accordingly, one object of the invention is to provide a new and improved fluorescent radiation converter.

Another object of this invention is to provide a fluorescent radiation converter which is relatively light in weight, simple, and low in cost.

An additional object of this invention is to provide a fluorescent radiation converter which has good optical quality.

Still another object of this invention is to provide a fluorescent radiation converter which absorbs substantially all of the incident radiation.

A further object of the invention is to provide a fluorescent radiation converter which minimizes reabsorption of the emitted fluorescent radiation.

A still further object of the invention is to provide a fluorescent radiation converter which minimizes scattering of the emitted fluorescent radiation.

Another object of this invention is to provide a fluorescent radiation converter which maintains a relatively long attenuation length.

A still further object of the invention is to provide a fluorescent radiation converter which maintains a large boundary area with the incident radiation while at the same time providing substantially 100 percent conversion to a fluorescent radiation that has a substantially high intensity at the edge of the fluorescent radiation converter.

STATEMENT OF INVENTION

Briefly, these and other objects are obtained with a fluorescent radiation converter having a substantially undoped optically transpaent substrate and a waveshifter coating deposited on at least one portion of the substrate for absorption of radiation and conversion thereof to fluorescent radiation. The waveshifter coating includes substantially 1000 g/liter of a solvent, 70 to 200 g/liter of an organic polymer, and 0.2 to 25 g/liter of at least one organic fluorescent dye.

Other objects, features and advantages of the invention will be apparent from the following detailed description of the invention taken in conjunction with the accompanying drawings.

BRIEF DESCRIPTION OF DRAWINGS

In the drawings like parts are designated by the same references in the figures, wherein:

FIGS. 2A, 2B, and 2C are perspective views of alternative embodiments of the invention.

FIG. 4 is a graph of the attenuation length of a fused silica substrate for the blue, green, and red waveshifter coatings.

DETAILED DESCRIPTION OF THE INVENTION

Figure 1:
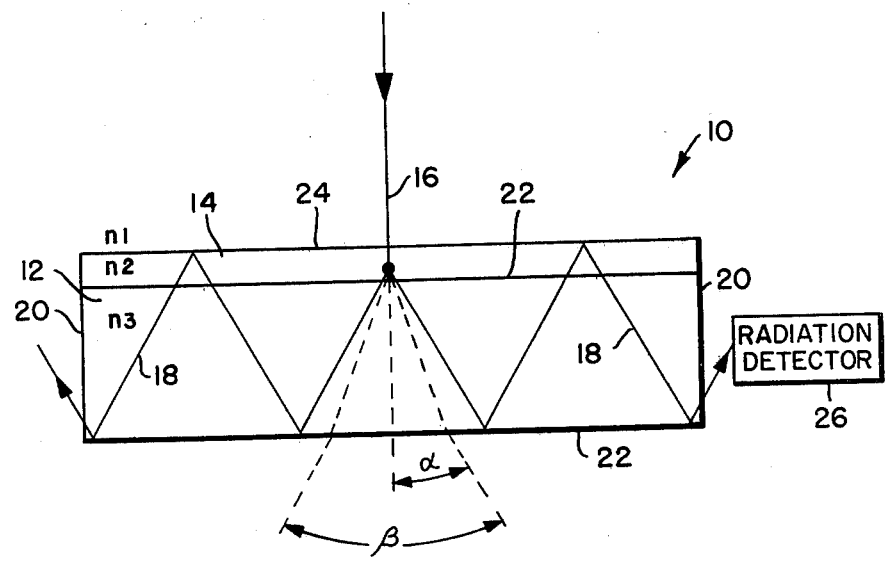
FIG. 1 is a side view of the invention showing the substrate and waveshifter coating on one surface of the substrate.

FIG. 1 illustrates the fluorescent radiation converter, generally designated by numeral 10, of this invention. The fluorescent radiation converter includes a substantially undoped optically transparent substrate 12 and a waveshifter coating 14 deposited on at least one portion of the substrate for absorption of incident radiation 16 and conversion thereof to fluorescent radiation 18. The waveshifter coating is composed of substantially 1000 g/liter of a solvent, 70 to 200 g/liter of an organic polymer, and 0.2 to 25 g/liter of at least one organic fluorescent dye.

More particularly, unlike the prior art substrates which are doped with radiation conversion material, substrate 12 is formed from material which is substantially undoped with foreign material which tends to absorb and scatter emitted radiation 18. In this manner, substrate 12 will have a relatively long attenuation length. The substrate is formed of substantially optically transparent material for further increasing the emitted radiation attenuation length as it travels to edges 20 of the substrate.

Figure 2A:
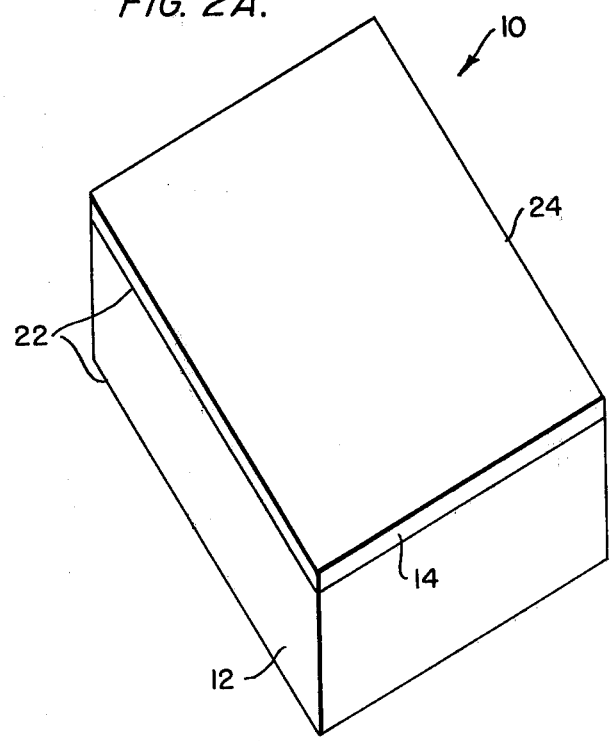

Preferably, substrate 12 is formed of any optically transparent material having a good boundary surface 22 quality so that the emitted radiation is substantially totally internally reflected through the substrate without being scattered by imperfections. Thus, it is preferred that fused silica or glass be used as the substrate. However, other materials such as polymethylmethacrylate (PMMA) may also be used. Although the attenuation length within PMMA is not as long as in fused silica or glass, the advantage of using PMMA is that it can be easily extruded or cast into many shapes, as illustrated in FIGS. 2A–2C. FIG. 2A shows the substrate as a sheet of material wherein boundary surfaces 22 are of a relatively large surface area compared to the thickness. This configuration is ideal for solar radiation conversion wherein the incoming radiation is amplified at edges 20. FIGS. 2B and 2C illustrate the substrate in cylindrical and rectangular configurations, respectively wherein the incoming radiation is relatively intense and the emitted radiation must travel over substantial distances through the substrate.

Waveshifter coating 14 is deposited on substrate 12 from liquid solutions containing a fluorescent radiation conversion dye or combination of dyes and an organic polymer dissolved in a solvent. Preferably, coating 14 is deposited on substrate 12 by any conventional method such as by dipping and withdrawal with controlled speed or by spraying. When depositing coating 14 on a substrate having a large boundary surface 22, such as illustrated in FIG. 2A, it is desirable to coat only one surface of the substrate because the incident radiation will usually be coming from only one direction. When the incident radiation comes from all directions it is preferable to coat all the boundary surface layers of the substrate, as illustrated in FIGS. 2B and 2C.

The optical density of waveshifter coating 14 within the fluorescent dye-absorption band is a function of the dye concentration and coating thickness. The coating thickness, in turn, is a function of the viscosity of the coating and, therefore, is a function of the molecular weight and concentration of the organic polymer. Total incident radiation absorption and minimum thickness of coating 14 are the desirable characteristics to ensure minimum reabsorption and scattering of emitted radiation 18 by the coating. The best results are obtained by using fluorescent dye concentrations close to their solubility limits and organic polymer concentrations which allow a single dipping of the substrate. Generally, minimum coating thickness and total absorption are obtained with organic dye concentrations ranging from 1.2 to 25 g/liter, organic polymer concentrations ranging from 70 to 200 g/liter and solvent concentrations of substantially 1000 g/liter. Such coating concentrations yield coating thicknesses of less than 10 $\mu$m and, in many instances, less than 5 $\mu$m can be obtained with a single dipping.

As indicated hereinbefore, one requirement for achieving full absorption and conversion of incident radiation in a coating 14 of less than 10 $\mu$m is high solubility of the fluorescent dyes in the solvent. It has been found that most fluorescent dyes have a high solubility in solvents of toluene or xylene; however, fluorescent dyes of longer wavelength have a higher solubility in solvents of ethanol, methanol, or water.

To give coating 14 the ability to properly adhere to substrate 12 and to give the coating proper hardness, an organic polymer is added to the coating solution. Preferably, the organic polymer is an acrylic resin such as, isobutyl methacrylate and ethylmethacrylate, which dissolve fast in toluene and produce a coating thickness and hardness giving maximum radiation conversion. Another usable acrylic resin is methylmethacrylate. However, it dissolves much slower in toluene than isobutyl methacrylate or ethylmethacrylate but, on the other hand, it gives a much harder coating. These acrylic resins may be obtained from DuPont Corporation by ordering Elvacite Acrylic Resin Grade No. 2045 (isobutyl methacrylate), 2043 (ethylmethacrylate), and 2041 (methylmethacrylate). Although the acrylic resins are preferred other organic polymers may also be used such as polyvinyltoluene, polyvinyl alcohol, and polystyrene. Polyvinyltoluene and polystyrene may be used with toluene and Xylene while polyvinyl alcohol may be used with water.

The fluorescent dyes selected as a constituent of waveshifter coating 14 are preferably selected for their solubilities in the solvents and organic polymers and for their optical absorption and conversion efficiencies. To achieve broad spectral absorption characteristics in diverse wavelength regions, various coatings have been formulated. One coating absorbs ultraviolet radiation and converts it to radiation in the blue wavelength region. Another coating absorbs blue radiation and converts it to radiation in the green wavelength region. Still another coating absorbs green radiation and converts it to radiation in the red wavelength region. All three coatings are obtained by combining the solvent and organic polymer with an appropriate fluorescent dye or combination of fluorescent dyes which will absorb the appropriate radiation and re-emit it at the desired longer wavelength.

Organic fluorescent dyes which may be used to convert ultraviolet radiation to the longer wavelength blue radiation, while at the same time produce maximum absorption and emission efficiencies, have been found to be para-terphenyl, which can be obtained from the Aldridge Chemical Company; Bis-MSB, which can be obtained from the Pilot Division of New England Nuclear Company; PPO, which can be obtained from the Pilot Division of New England Nuclear Company; and stilbene, which can be obtained from Interactive Radiation Incorporated.

Organic fluorescent dyes which may be used to convert blue radiation to the longer wavelength green radiation while producing maximum absorption and emission efficiencies have been found to be Laser Dye Number 481, which can be obtained from the Pilot Division of New England Nuclear Company; Laser Dye Number 495, which can be obtained from the Pilot Division of New England Nuclear Company; and BBQ, which can be obtained from Nuclear Enterprises Company.

Organic fluorescent dyes which may be used to convert green radiation to the longer wavelength red radiation while producing maximum absorption and emission efficiencies have been found to be Hostasol Red GG, which can be obtained from American Hoechst Corporation, and rhodamine 6G, which can be obtained from the Pilot Division of New England Nuclear Company.

Although the above listed organic fluorescent dyes may be used individually in formulating the various waveshifter coatings it is preferable to combine various dyes with overlapping absorption bands to increase the absorption and emission efficiencies. The preferred waveshifter coating for converting ultraviolet radiation to blue radiation includes substantially 1000 g/liter of toluene, substantially 100 g/liter of an acrylic resin which preferably is isobutyl methacrylate, and substantially 1 g/liter of para-terphenyl, 2 g/liter of Bis-MSB, and 8 g/liter of PPO.

Figure 3:
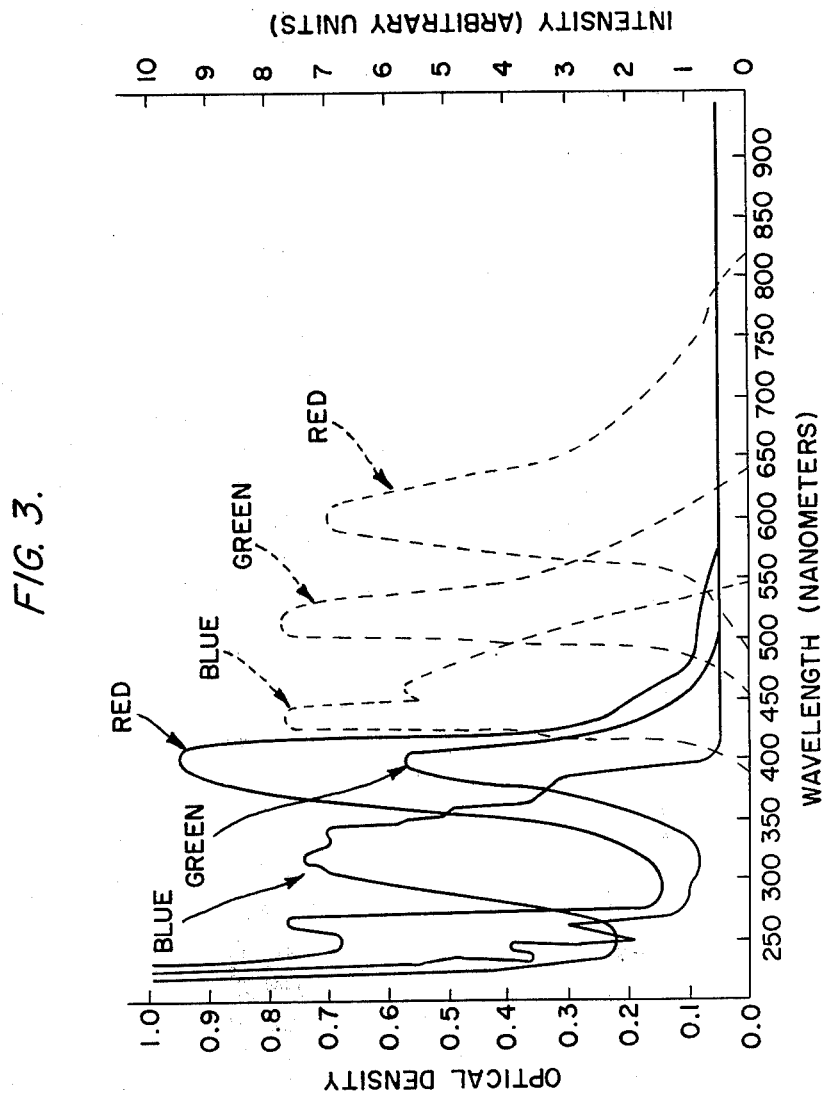
FIG. 3 is a graph of the absorption and emission characteristics for the blue, green, and red waveshifter coatings.

The graph of FIG. 3 depicts the absorption and emission spectrums of the above "blue" coating as a function of the optical density of the waveshifter coating and the wavelength of the absorbed and emitted radiation. The "blue" solid line graph depicts the absorption spectrum and the "blue" dotted line graph depicts the emission spectrum. The "blue" coating was deposited on the substrate to a thickness of about 0.5 $\mu$m by dipping. The broad absorption region, ranging from about 250 nm to about 400 nm with a peak at about 320 nm, is a composite of the absorption bands associated with the individual organic fluorescent dyes of the coating. The radiation absorbed by the para-terphenyl and PPO is transferred efficiently to the Bis-MSB by radiative transfer, resulting in an emission curve ranging from about 400 nm to about 500 nm with a peak at about 430 nm. As shown by the graph the ultraviolet light is absorbed and then emitted as "blue" radiation at a longer wavelength with an internal photon conversion efficiency of substantially 100 percent.

Although the above coating is preferred for converting ultraviolet radiation to "blue" radiation an alternative coating may be used which includes substantially 1000 g/liter of water, substantially 100 g/liter of polyvinyl alcohol, and substantially 10 g/liter of stilbene.

The preferred coating for converting "blue" radiation to "green" radiation includes substantially 1000 g/liter of toluene, substantially 175 g/liter of an acrylic resin which preferably is isobutyl methacrylate, and substantially 4.5 g/liter of organic fluorescent dyes which preferably includes substantially 4 g/liter of Laser Dye Number 481 and substantially 0.5 g/liter of the dye Hostasol Yellow 8G which may be obtained from American Hoeschst Corporation. Although this coating is preferred, it has been found that the fluorescent dye Hostasol Yellow 8G will dissolve more quickly and completely when 200 g/liter of ethanol is added to the solution.

FIG. 3 also illustrates the absorption and emission spectrums of the above "green" coating. The "green" solid line graph depicts the absorption spectrum and the "green" dotted line graph depicts the emission spectrum. The "green" absorption curve ranges from about 340 nm to about 500 nm so that it overlaps the "blue" emission curve at about 430 nm. As shown by the "green" emission graph the emitted radiation ranges from about 460 nm to about 640 nm which leads to an efficient transfer and leads to a very intense emission centered at about 510 nm and extending well into the red portion of the spectrum.

The preferred coating for converting "green" radiation to "red" radiation includes substantially 1000 g/liter of toluene, substantially 100 g/liter of the acrylic resin isobutyl methacrylate, and substantially 4.7 g/liter of organic fluorescent dyes which preferably includes substantially 4 g/liter of Laser Dye Number 481, substantially 0.5 g/liter of Hostasol Yellow 8G, and substantially 0.2 g/liter of Hostasol Red GG. Although this coating is preferred, it has been found that the two fluorescent dyes Hostasol Yellow 8G and Hostasol Red GG will dissolve more quickly and completely if 200 g/liter of ethanol is added to the solution.

FIG. 3 also illustrates the absorption and emission spectrums of the above "red" coating. The "red" solid line graph depicts the absorption spectrum and the "red" dotted line graph depicts the emission spectrum. The "red" absorption curve ranges from about 330 nm to about 560 nm so that it overlaps the "green" emission curve at about 470 nm. As shown by the "red" emission graph the emitted radiation ranges from about 500 nm to about 820 nm which leads to an efficient transfer and leads to a very intense emission centered at about 610 nm and extending well into the infrared region.

Although the above coating is preferred for converting "green" radiation to "red" radiation an alternative coating may be used which includes substantially 1000 g/liter of water, substantially 100 g/liter of polyvinyl alcohol, and substantially 10 g/liter of rhodamine.

Referring back to FIG. 1, in the operation of fluorescent radiation converter 10, the incoming incident radiation 16 impinges on coating 14 and enters therein. The incident radiation is absorbed by the fluorescent dyes within the coating and is re-emitted by the fluorescent dyes at a longer wavelength. The emitted radiation 18 enters substrate 12 where it is trapped in the substrate by total internal reflection for angles greater than the critical angle $\alpha$ when the index of refraction n3 of the substrate is greater than the index of refraction n1 of the surrounding medium. Because the radiation emitted within the coating must enter and be trapped by the substrate, it is desirable that the index of refraction n2 of the coating be approximately the same as the index of refraction n3 of the substrate. The emitted radiation contained within the cone subtended by angle $\beta$ will escape from the substrate through boundary surface 22 which does not abut coating 14 and will also escape from boundary surface 24 of the coating. The emitted radiation will be continuously reflected between surfaces 22 and 24 until it reaches termini 20 of the substrate. The emitted radiation exits the substrate through ends 20 where it can be detected by any appropriate conventional radiation detector 26.

Because the substrate is made of undoped optically clear material, there are substantially no impurities or imperfections within the substrate which will absorb or scatter the internally reflected emitted radiation 18. However, when the emitted radiation re-enters coating 14 upon reflection, the emitted radiation will be subjected to re-absorption and scattering, but because the coating is extremely thin in comparison to the thickness of the substrate only a very slight amount of emitted radiation is re-absorbed and scattered. Consequently, most of the emitted radiation which is totally internally reflected will not be absorbed or scattered.

FIG. 4 illustrates the intensity of the emitted fluorescent radiation as it travels through the substrate when a cylindrical substrate rod made of fused silica is coated with each of the "blue," "green," and "red" coatings. As shown by the curves the blue and green fluorescent radiation intensity remains fairly constant while the red decreases as they travel through the substrate. On substrates of good surface quality the initial decrease in intensity from 0 to about 30 internal reflections is due to the absorption of the short wavelength tail of the blue, green, and red fluorescent spectrum due to the finite overlap of absorption and emission spectrums. This self-absorption is most pronounced for the "red" coating while the self-absorption losses by the "blue" and "green" coatings are less pronounced. Beyond 30 internal reflections the self-absorption by the "blue" and "green" coatings is almost non-existant while the self-absorption by the "red" coating continues to persist. Even with the less intense red fluorescent radiation, the intensity of all three fluorescent radiations in much greater over a greater distance than when the substrate is doped with a radiation converting material.

A fluorescent radiation converter has been described. Obvious modifications and variations of the radiation convertor are possible in light of the above teachings. It is to be understood, therefore, that within the scope of the appended claims the radiation converter may be practiced otherwise than as specifically described and illustrated.

Accordingly, the invention having been described in its best embodiment and mode of operation, that which is desired to be claimed by Letters Patent is:

1. A fluorescent radiation converter, comprising:
   a substantially undoped optically transparent substrate; and
   a waveshifter coating deposited on at least one portion of said substrate for absorption of impinging radiation and conversion thereof to fluorescent radiation, said coating including
   substantially 1000 g/liter of a solvent, 70 to 200 g/liter of an organic polymer, and 0.2 to 25 g/liter of at least one organic fluorescent dye.

2. The fluorescent radiation converter of claim 1 wherein said substantially undoped optically transparent substrate is selected from the group consisting of glass, fused silica, and polymethylmethacrylate.

3. The fluorescent radiation converter of claim 1 wherein said substrate is formed from extruded polymethylmethacrylate.

4. The fluorescent radiation converter of claim 1 wherein said solvent is selected from the group consisting of xylene, toluene, and water.

5. The fluorescent radiation converter of claim 5 wherein said organic polymer is selected from the group consisting of methylmethacrylate, ethylmethacrylate, isobutyl methacrylate, polyvinyltoluene, polystyrene, and polyvinyl alcohol.

6. The fluorescent radiation converter of claim 1 wherein said organic fluorescent dye converts ultraviolet radiation to blue radiation.

7. The fluorescent radiation converter of claim 1 wherein said organic fluorescent dye converts blue radiation to green radiation.

8. The fluorescent radiation converter of claim 1 wherein said organic fluorescent dye converts green radiation to red radiation.

9. The fluorescent radiation converter of claim 1 wherein said waveshifter coating includes:
   substantially 1000 g/liter of toluene;
   substantially 100 g/liter of an acrylic resin; and
   substantially 11 g/liter of at least one organic fluorescent dye that converts ultraviolet radiation to blue radiation.

10. The fluorescent radiation converter of claim 1 wherein said waveshifter coating includes:
    substantially 1000 g/liter of toluene;
    substantially 175 g/liter of an acrylic resin; and
    substantially 4.5 g/liter of at least one organic fluorescent dye that converts blue radiation to green radiation.

11. The fluorescent radiation converter of claim 1 wherein said waveshifter coating includes:
    substantially 1000 g/liter of toluene;
    substantially 100 g/liter of an acrylic resin; and
    substantially 4.7 g/liter of at least one organic fluorescent dye that converts green radiation to red radiation.

12. The fluorescent radiation converter of claims 10 and 11 further including substantially 200 g/liter of ethanol.

13. The fluorescent radiation converter of claims 9, 10, and 11 wherein said acrylic resin is isobutyl methacrylate.

14. The fluorescent radiation converter of claim 1 wherein said waveshifter coating includes:
    substantially 1000 g/liter of water;
    substantially 100 g/liter of polyvinyl alcohol; and substantially 10 g/liter of stilbene for converting ultraviolet radiation to blue radiation.

15. The fluorescent radiation converter of claim 1 wherein said waveshifter coating includes:
   substantially 1000 g/liter of water;
   substantially 100 g/liter of polyvinyl alcohol; and
substantially 10 g/liter of rhodamine for converting green radiation to red radiation.

16. The fluorescent radiation converter of claim 1 wherein said waveshifter coating is less than 10 μm.

17. The fluorescent radiation converter of claim 1 wherein said waveshifter coating is less than 5 μm.